United States Patent
Deak et al.

(10) Patent No.: US 9,804,235 B2
(45) Date of Patent: Oct. 31, 2017

(54) SINGLE MAGNETORESISTOR TMR MAGNETIC FIELD SENSOR CHIP AND MAGNETIC CURRENCY DETECTOR HEAD

(71) Applicant: Multidimension Technology Co., Ltd., Zhangjiagang (CN)

(72) Inventors: James Geza Deak, Zhangjiagang (CN); Haiping Guo, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 14/907,691

(22) PCT Filed: Jul. 25, 2014

(86) PCT No.: PCT/CN2014/082986
§ 371 (c)(1),
(2) Date: Jan. 26, 2016

(87) PCT Pub. No.: WO2015/010649
PCT Pub. Date: Jan. 29, 2015

(65) Prior Publication Data
US 2016/0169987 A1      Jun. 16, 2016

(30) Foreign Application Priority Data
Jul. 26, 2013   (CN) .................... 2013 2 0451445 U

(51) Int. Cl.
G01R 33/09      (2006.01)
G07D 7/04       (2016.01)

(52) U.S. Cl.
CPC .......... G01R 33/098 (2013.01); G01R 33/09 (2013.01); G07D 7/04 (2013.01)

(58) Field of Classification Search
CPC combination set(s) only.
See application file for complete search history.

(56) References Cited

U.S. PATENT DOCUMENTS

| | | | |
|---|---|---|---|
| 2002/0081458 A1* | 6/2002 | Hasegawa | B82Y 10/00 428/815 |
| 2005/0207070 A1 | 9/2005 | Carey et al. | |
| 2008/0124581 A1* | 5/2008 | Miura | B82Y 10/00 428/811.1 |

FOREIGN PATENT DOCUMENTS

| | | |
|---|---|---|
| CN | 1588109 | 3/2005 |
| CN | 102298126 | 12/2011 |

(Continued)

OTHER PUBLICATIONS

"International Application No. PCT/CN2014/082986, International Search Report and Written Opinion dated Oct. 27, 2014", (Oct. 27, 2014), 13 pgs.

(Continued)

*Primary Examiner* — Clayton E Laballe
*Assistant Examiner* — Jas Sanghera
(74) *Attorney, Agent, or Firm* — Schwegman Lundberg & Woessner, P.A.

(57) ABSTRACT

A single magnetoresistor TMR magnetic field sensor chip and magnetic currency detector head; the single magnetoresistor TMR magnetic field sensor chip is installed above a magnetic excitation element; the sensing direction of the chip is parallel to the surface of the chip, and the direction of the magnetic excitation field generated at the chip by the magnetic excitation element is perpendicular to the surface of the chip; the chip comprises a substrate, a magnetic biasing structure deposited on the substrate, a magnetoresistive element, and an input/output terminal; the magnetoresistive element consists of MTJs; the sensing directions of the magnetoresistive element and the MTJs are the same as the sensing direction of the chip; and the direction of a bias magnetic field generated on the chip by the magnetic biasing structure is perpendicular to the sensing direction of (Continued)

the chip. The chip features high sensitivity, high signal-to-noise ratio, small size, high temperature stability and high reliability.

13 Claims, 7 Drawing Sheets

(56) References Cited

FOREIGN PATENT DOCUMENTS

| CN | 102298126 A | * | 12/2011 | ............ G01R 33/09 |
|---|---|---|---|---|
| CN | 202210144 U | | 5/2012 | |
| CN | 102722932 A | | 10/2012 | |
| CN | 202494772 U | | 10/2012 | |
| CN | 102968845 A | | 3/2013 | |
| CN | 203038357 U | | 7/2013 | |
| CN | 203551758 | | 4/2014 | |
| WO | WO-2012157558 | | 11/2012 | |
| WO | WO-2015010649 | | 1/2015 | |

OTHER PUBLICATIONS

"European Application No. 14829581.9, Extended European Search Report dated Feb. 8, 2017", (Feb. 8, 2017), 17 pgs.

* cited by examiner

SINGLE MAGNETORESISTOR TMR MAGNETIC FIELD SENSOR CHIP AND MAGNETIC CURRENCY DETECTOR HEAD

PRIORITY CLAIM TO RELATED APPLICATIONS

This application is a U.S. national stage application filed under 35 U.S.C. §371 from International Application Serial No. PCT/CN2014/082986, which was filed 25 Jul. 2014, and published as WO2015/010649 on 29 Jan. 2015, and which claims priority to Chinese Application No. 201320451445.2, filed 26 Jul. 2013, which applications and publication are incorporated by reference as if reproduced herein and made a part hereof in their entirety, and the benefit of priority of each of which is claimed herein.

TECHNICAL FIELD

The present invention relates to the field of magnetic field sensors, and in particular, to a single magnetoresistor TMR magnetic field sensor chip and a magnetic currency detector head manufactured based on the chip.

BACKGROUND ART

In daily life, the magnetic currency detector head has a very wide range of applications, for example, the magnetic currency detector head is required in devices such as vending machines and cash-counting machines. In the current mainstream magnetic currency detector head technology, a magnetic head taking indium antimonide as a sensitive material is used, magnetic lines of force are perpendicular to a detection surface, when paper money passes through the magnetic head, the magnetic field will change, and identification of the authenticity of the paper money is realized by detecting the change of the magnetic field. However, such a magnetic head has low sensitivity, low signal-to-noise ratio, large size, poor temperature stability and poor reliability.

SUMMARY OF THE INVENTION

An objective of the present invention is to provide a single magnetoresistor TMR magnetic field sensor chip and a magnetic currency detector head, to increase sensitivity, signal-to-noise ratio, temperature stability and reliability and reduce the size of the magnetic head.

The present invention provides a single magnetoresistor TMR magnetic field sensor chip, including:

a single magnetoresistor TMR magnetic field sensor chip, installed above a magnetic excitation element, the sensing direction of the chip being parallel to the surface of the chip, and the direction of a magnetic excitation field generated on the chip by the magnetic excitation element being perpendicular to the surface of the chip, wherein the single magnetoresistor TMR magnetic field sensor chip includes:

a substrate, a magnetic biasing structure deposited on the substrate, a magnetoresistive element, and input and output terminals;

the magnetoresistive element consists of at least one MTJ unit;

the MTJ unit consists of at least one MTJ string;

the MTJ string consists of at least one MTJ;

the sensing directions of the magnetoresistive element and the MTJ are the same as the sensing direction of the chip; and the direction of a bias magnetic field generated on the chip by the magnetic excitation element is perpendicular to the sensing direction of the chip.

Preferably, the magnetoresistive element consists of at least two MTJ units connected in parallel or connected in series, the MTJ units are arranged along a direction perpendicular or parallel to the sensing direction of the single magnetoresistor TMR magnetic field sensor chip, and a centre distance between two adjacent MTJ units is 200 μm to 800 μm;

and/or;

the MTJ units consist of at least two MTJ strings connected in parallel or connected in series, the MTJ strings are arranged along a direction perpendicular or parallel to the sensing direction of the single magnetoresistor TMR magnetic field sensor chip, and a centre distance between two adjacent MTJ strings is 20 μm to 100 μm;

and/or;

the MTJ strings consist of at least two MTJs connected in parallel or connected in series, the MTJs are arranged along a direction perpendicular or parallel to the sensing direction of the single magnetoresistor TMR magnetic field sensor chip, and a centre distance between two adjacent MTJs is 1 μm to 20 μm.

Preferably, the shape of the MTJ viewed from above is an ellipse, a ratio of lengths of its major axis and minor axis is greater than 3, and the minor axis of the MTJ is parallel to the sensing direction of the chip.

Preferably, in the absence of an external magnetic field, a magnetization direction of a free layer in the MTJ, under the action of the magnetic biasing structure, is parallel to the direction of the major axis of the MTJ.

Preferably, the magnetic biasing structure is blocky or layered, and is made of an alloy consisting of Cr, Co, Pt, Pd, Ni or Fe.

Preferably, the magnetic biasing structure consists of a permanent magnet between two adjacent MTJ strings; along a magnetization direction of the permanent magnet, two sides of the MTJ are both provided with the permanent magnet; and a magnetic field generated at the permanent magnet by the magnetic excitation element is less than half of the coercive force of the permanent magnet, and is less than 0.1 T.

Preferably, the magnetic biasing structure consists of a magnetic film deposited on the MTJ; a magnetic field generated at the magnetic film by the magnetic excitation element is less than half of the coercive force of the magnetic film, and is less than 0.1 T.

Preferably, the magnetic biasing structure consists of an exchange interaction layer deposited on the MTJ, and the exchange interaction layer includes an anti-ferromagnetic layer and a ferromagnetic layer weakly coupled with the anti-ferromagnetic layer.

Preferably, both the input and output terminals at least include two wire bonding pads, and each wire bonding pad is located on two ends of the single magnetoresistor TMR magnetic field sensor chip.

Preferably, multiple single magnetoresistor TMR magnetic field sensor chips are electrically connected with each other through the wire bonding pads, to form a sensor chip combination, and the sensing zone area of the sensor chip combination is greater than that of a single one of the single magnetoresistor TMR magnetic field sensor chips.

Preferably, the wire bonding pad has a length of 15 μm to 2000 μm and a width of 15 μm to 1000 μm.

Preferably, the substrate is provided thereon with an electrical connection conductor for achieving an electrical connection, and the width of the electrical connection conductor is not less than 10 μm.

Preferably, the single magnetoresistor TMR magnetic field sensor chip has a length of 500 μm to 3000 μm and a width of 20 μm to 1500 μm.

The present invention further correspondingly provides a magnetic currency detector head, wherein the magnetic head includes:

at least one of the single magnetoresistor TMR magnetic field sensor chip according to any one of the above, a signal processing circuit, a magnetic excitation element, an output pin and a circuit board;

the magnetic excitation element is installed below the single magnetoresistor TMR magnetic field sensor chip, used for providing a magnetic excitation field, to generate an external magnetic field in the sensing direction of the chip in a measured space;

the single magnetoresistor TMR magnetic field sensor chip senses the external magnetic field, and converts the external magnetic field to an electrical signal; and the signal processing circuit converts the electrical signal, which is transferred to the output pin through the circuit board.

According to the specific embodiments provided in the present invention, the present invention discloses the following technical effects:

the present invention provides a single magnetoresistor TMR magnetic field sensor chip of which the sensing direction is parallel to the surface of the chip, wherein the direction of a magnetic excitation field generated on the chip by the magnetic excitation element is perpendicular to the surface of the chip, and a magnetoresistive element of the chip consists of an MTJ; the sensing directions of the magnetoresistive element and the MTJ are the same as the sensing direction of the chip; and the direction of a bias magnetic field generated on the chip by the magnetic excitation element is perpendicular to the sensing direction of the chip. The chip of the present invention has high sensitivity, high signal-to-noise ratio, small size, high temperature stability and high reliability.

BRIEF DESCRIPTION OF THE DRAWINGS

In order to illustrate the technical solutions in embodiments of the present invention or the prior art more clearly, the accompanying drawings to be used for describing the embodiments are introduced briefly in the following. Apparently, the accompanying drawings in the following description are only some embodiments of the present invention; the persons of ordinary skill in the art can obtain other drawings according to the accompanying drawings without any creative efforts.

DETAILED DESCRIPTION OF THE PREFERRED EMBODIMENTS

The technical solution in the embodiments of the present invention will be clearly and fully described below with reference to the accompanying drawings in the embodiments of the present invention. It is apparent that the embodiments to be described are only a part rather than all of the embodiments of the present invention. All other embodiments derived by persons of ordinary skill in the art based on the embodiments of the present invention without paying creative efforts belong to the protection scope of the present invention.

Figure 1:
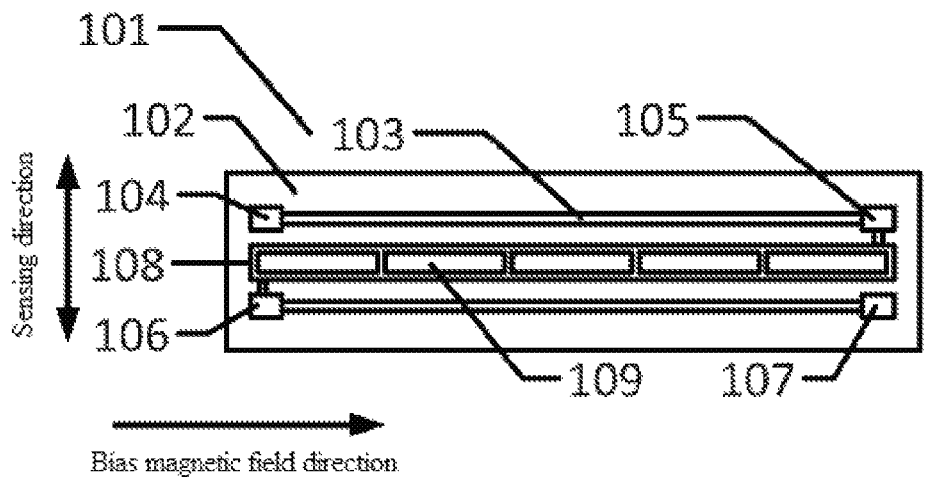
FIG. 1 is a schematic view of a single magnetoresistor TMR magnetic field sensor chip.

Embodiment 1 of the present invention provides a single reluctance TMR (Tunnel magnetoresistance) magnetic field sensor chip. FIG. 1 is a schematic view of a single magnetoresistor TMR magnetic field sensor chip 101. In an actual application, the length of the chip may be 500 μm to 3000 μm and the width may be 20 μm to 1500 μm, which are not limited to the above sizes. All components in the chip are located on a substrate 102, and the substrate 102 may be composed of a material such as silicon, ceramic and resin that can fabricate an integrated circuit. The silicon substrate is used in the present invention. A magnetoresistive element 108 consists of an MTJ (Magnetic Tunnel Junction) unit 109, or consists of at least two MTJ units 109 connected in series or connected in parallel. The magnetoresistive element 108 shown in FIG. 1 consists of five MTJ units 109 connected in parallel. One MTJ unit 109 consists of one MTJ string, or consists of more than two MTJ strings connected in parallel or connected in series. Each MTJ string consists of one MTJ, or consists of more than two MTJ connected in parallel or connected in series. The single magnetoresistor TMR magnetic field sensor chip, like the conventional resistor, has two terminals, which are respectively an input terminal and an output terminal, and each terminal has at least two wire bonding pads. The wire bonding pads may also be used for electrical connections among multiple single magnetoresistor TMR magnetic field sensor chips, the chips form a sensor chip combination, and the sensing zone area of the sensor chip combination is greater than that of a single one of the single magnetoresistor TMR magnetic field sensor chips.

104 and 105 in FIG. 1 are two wire bonding pads of one terminal of the single magnetoresistor TMR magnetic field sensor chip, and 106 and 107 are two wire bonding pads of the other terminal of the single magnetoresistor TMR magnetic field sensor chip. Preferably, the wire bonding pads 104-107 have a length of 15 μm to 2000 μm and a width of 15 μm to 1000 μm. The pads as well as the pads and the magnetoresistive element are connected with each other through an electrical connection conductor 103, and the electrical connection conductor 103 is made of a high conductivity material, of which the width is not less than 10 μm.

The aforementioned chip is installed above a magnetic excitation element, and the direction of a magnetic excitation field generated on the chip by the magnetic excitation element is perpendicular to the surface of the chip. The chip further includes a magnetic biasing structure (not shown) deposited on the substrate. The magnetic biasing structure may be blocky or layered, and the material used may be an alloy consisting of Cr, Co, Pt, Pd, Ni or Fe.

The direction of a bias magnetic field generated on the chip by the magnetic excitation element is perpendicular to the sensing direction of the chip, to make the magnetoresistive element operate in a linear zone and reduce hysteresis of the MTJ. In the present invention, the sensing direction of the chip is parallel to the surface of the chip, and the sensing directions of the magnetoresistive element and the MTJ are the same as the sensing direction of the chip.

Figure 3:
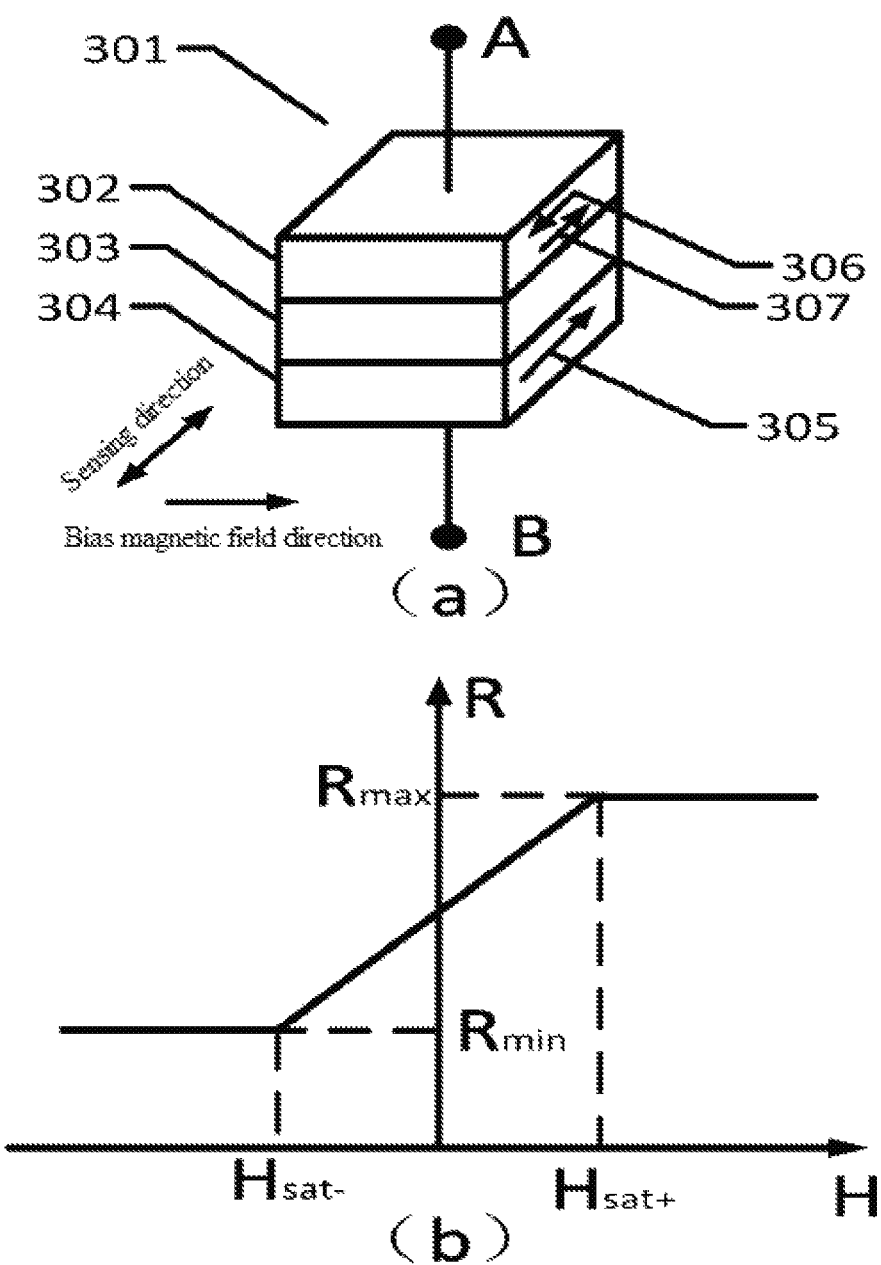
FIG. 3(a) is a schematic structural view of an MTJ.
FIG. 3(b) is a relation curve between resistance values and an external magnetic field.

The present invention uses the MTJ as a sensing element, which has advantages of high sensitivity, small size, low cost and low power consumption. A specific structure of the MTJ is as shown in FIG. 3(a), a tunnel layer 303 is between a ferromagnetic free layer 302 and a magnetic pinned layer 304, and a magnetization direction 305 of the magnetic pinned layer 304 is perpendicular to the direction of the bias magnetic field provided in the magnetic biasing structure. Under the action of the bias magnetic field, in the absence of an external magnetic field, a magnetization direction of the ferromagnetic free layer 302 is the same as the direction of the bias magnetic field. In the presence of an external magnetic field, the magnetization direction of the ferromagnetic free layer 302 will vary along with the external magnetic field. A end and B end of two terminals of the MTJ show characteristics of the resistance on a macro level, and the resistance value will vary with a change of the magnetization direction of the ferromagnetic free layer 302, when the magnetization direction of the ferromagnetic free layer 302 is parallel to the magnetization direction 305 of the magnetic pinned layer 304, as shown by the arrow 307, and the ferromagnetic free layer 302 is magnetized to saturation, the resistance between the A end and the B end is minimum, denoted as Rmin, and at this point, the external magnetic field is denoted as Hsat−; when the magnetization direction of the ferromagnetic free layer 302 is antiparallel to the magnetization direction 305 of the magnetic pinned layer 304, as shown by the arrow 306, and the ferromagnetic free layer 302 is magnetized to saturation, the resistance between the A end and the B end is maximum, denoted as Rmax, and at this point, the external magnetic field is denoted as Hsat+, as shown in FIG. 3(b). The resistance value of the MTJ changes linearly between Rmin and Rmax with the external magnetic field. Therefore, it is feasible to achieve measurement on the external magnetic field through the change of the resistance value of the MTJ.

Figure 4:
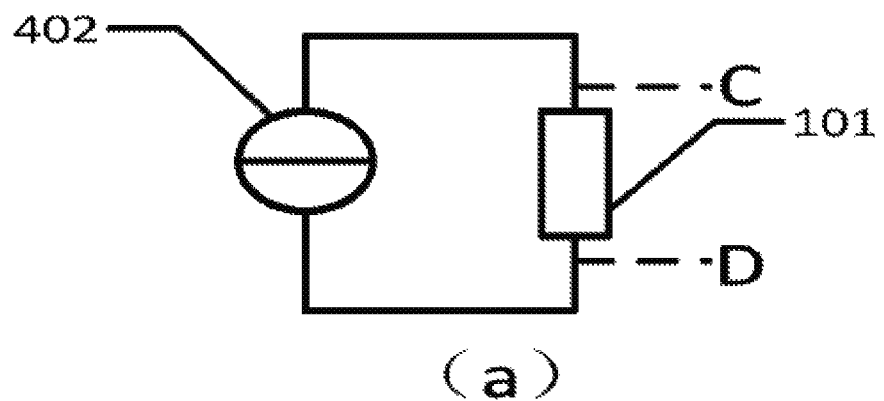
FIG. 4(a) is one schematic diagram of application of the single magnetoresistor TMR magnetic field sensor chip.
FIG. 4(b) is a relation curve between output voltages of the sensor chip corresponding to FIG. 4(a) and the external magnetic field.
Figure 4:
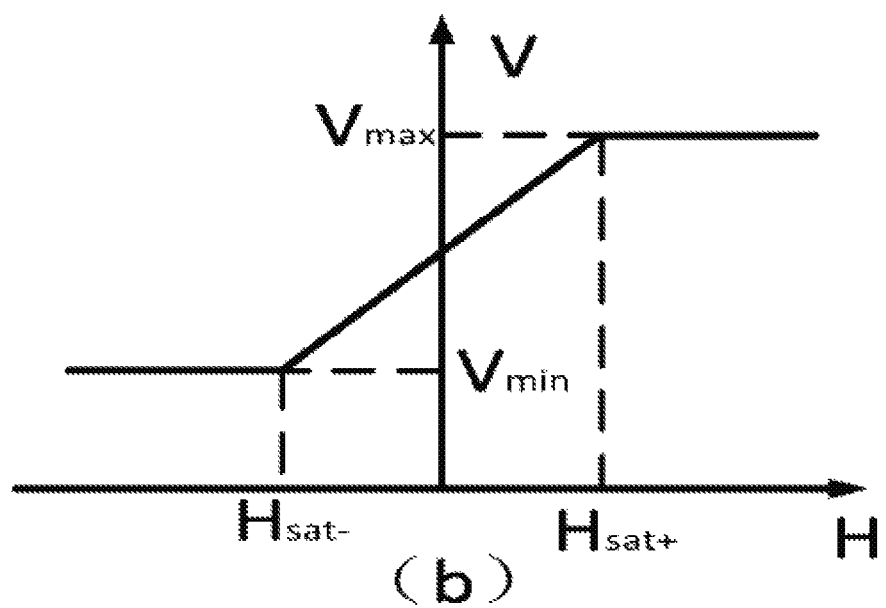

FIG. 4(a) and FIG. 4(b) are respectively a schematic diagram of application of the single magnetoresistor TMR magnetic field sensor chip 101 and a relation curve between output voltages and an external magnetic field. The two terminals of the single magnetoresistor TMR magnetic field sensor chip 101 are C end and D end shown in FIG. 4(a), and a current source 402 and the single magnetoresistor TMR magnetic field sensor chip 101 make up a loop. When the external magnetic field reaches the Hsat+ as shown in FIG. 4(b), the resistance of the single magnetoresistor TMR magnetic field sensor chip 101 is maximum, and at this point, a potential difference of the C end and the D end of the TMR magnetic field sensor chip is maximum, denoted as Vmax; when the external magnetic field reaches the Hsat− as shown in FIG. 4(b), the resistance of the TMR magnetic field sensor chip 101 is minimum, and at this point, the potential difference of the C end and the D end of the TMR magnetic field sensor chip is minimum, denoted as Vmin.

Figure 5:
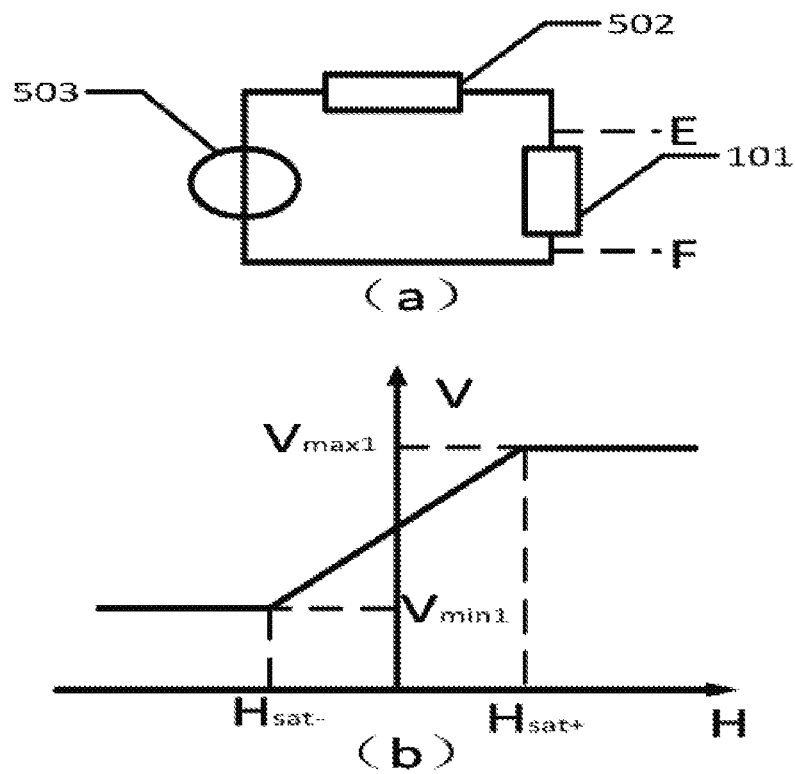
FIG. 5(a) is another schematic diagram of application of the single magnetoresistor TMR magnetic field sensor chip.
FIG. 5(b) is a relation curve between output voltages of the sensor chip corresponding to FIG. 5(a) and the external magnetic field.

FIG. 5(a) and FIG. 5(b) are respectively another schematic diagram of application of the single magnetoresistor TMR magnetic field sensor chip 101 and a relation curve between output voltages and an external magnetic field. The two terminals of the single magnetoresistor TMR magnetic field sensor chip 101 are E end and F end shown in FIG. 5(a), and a current source 503, a conventional resistor 502 and the single magnetoresistor TMR magnetic field sensor chip 101 make up a series loop. When the external magnetic field reaches the Hsat+ as shown in FIG. 5(b), the resistance of the single magnetoresistor TMR magnetic field sensor chip 101 is maximum, and at this point, a potential difference of the E end and the F end of the single magnetoresistor TMR magnetic field sensor chip is maximum, denoted as Vmax1; when the external magnetic field reaches the Hsat− as shown in FIG. 5(b), the resistance of the single magnetoresistor TMR magnetic field sensor chip 101 is minimum, and at this point, the potential difference of the E end and the F end of the single magnetoresistor TMR magnetic field sensor chip is minimum, denoted as Vmin1.

The magnetic biasing structure in the present invention has multiple forms.

Figure 6:
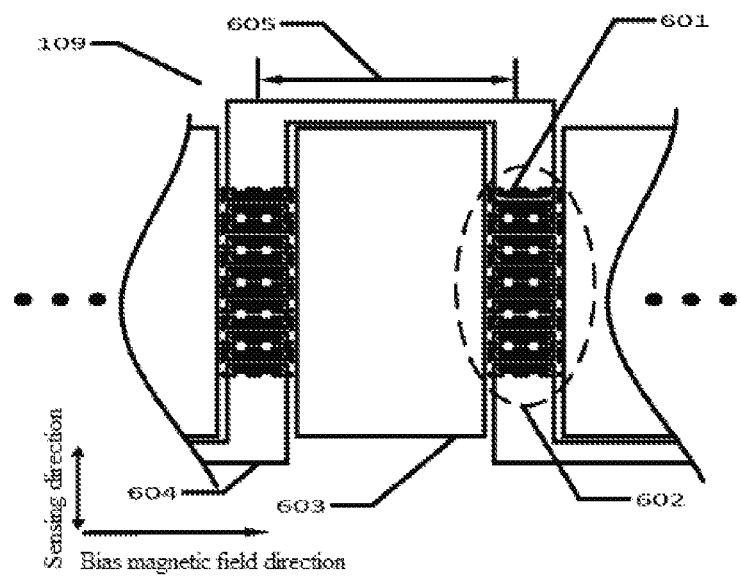
FIG. 6 is a schematic view of an MTJ unit formed in a first magnetic bias method.

Referring to FIG. 6, in the first form, the magnetic biasing structure consists of a permanent magnet between two adjacent MTJ strings which is integrated onto the chip. Twelve MTJs 601 make up one MTJ string 602, and the MTJs 601 are arranged along the sensing direction of the magnetic field sensor chip 101, wherein a centre distance between two adjacent MTJs 601 is 1 μm to 20 μm, which is 6 μm in this embodiment. Seven MTJ strings 602 are connected in series to make up one MTJ unit 109, and the MTJ strings 602 are arranged along a direction perpendicular to the sensing direction of the magnetic field sensor chip 101, wherein a centre distance 605 between two adjacent MTJ strings is 20 μm to 100 μm, which is 54 μm in this embodiment. Five MTJ units 109 are connected in parallel to make up one magnetoresistive element 108, and a centre distance between two adjacent MTJ units 109 is 200 μm to 800 μm, which is 429 μm in this embodiment. The MTJ units 109 are arranged along a direction perpendicular to the sensing direction of the single magnetoresistor TMR magnetic field sensor chip 101. Between two adjacent MTJ strings 602 is a permanent magnet 603 integrated onto the chip; an electrical connection conductor 604 composed of a conductive material achieves an electrical connection between the two adjacent MTJ strings 602.

Figure 7:
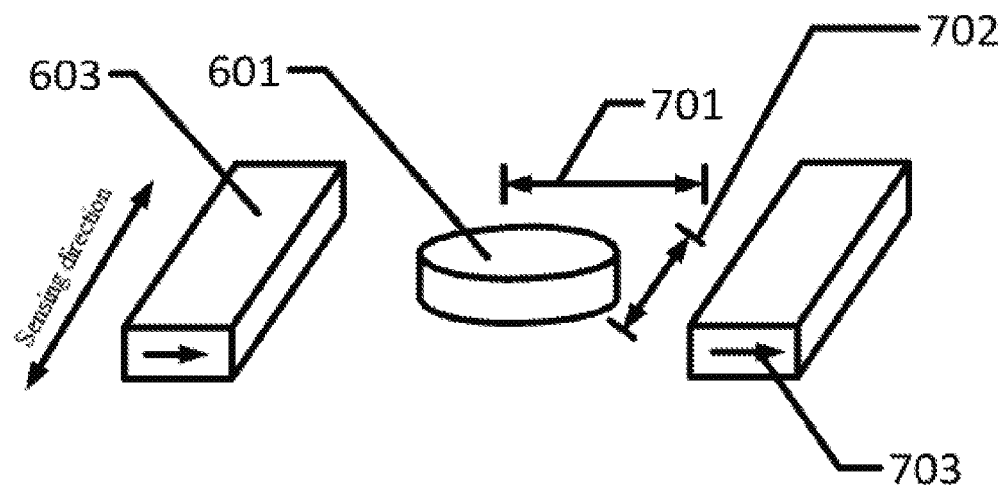
FIG. 7 is a relationship of positions of an MTJ and a permanent magnet adjacent thereto in the first magnetic bias method.

FIG. 7 shows a relationship of positions of the permanent magnet 603 and the MTJ 601 in the first form. A magnetization direction 703 of the permanent magnet 603 is perpendicular to the sensing direction of the magnetic field sensor chip and parallel to the direction of a major axis of the MTJ 601, that is, the direction of an easy magnetization axis, which can thus reduce hysteresis of the MTJ 601. Along the magnetization direction 703 of the permanent magnet 603, two sides of the MTJ 601 are both provided with the permanent magnet 603. The MTJ 601 is in a shape of an ellipse, and a ratio of lengths of its major axis and minor axis is greater than 3. A major axis 701 is the easy magnetization axis of the MTJ 601, and a minor axis 702 is a hard magnetization axis of the MTJ 601. In order not to make the permanent magnet 603 magnetized by the magnetic excitation element to lead to failure, a magnetic field generated at the permanent magnet 603 by the magnetic excitation element should be less than half of the coercive force of the permanent magnet 603, and shall be less than 0.1 T.

Figure 8:
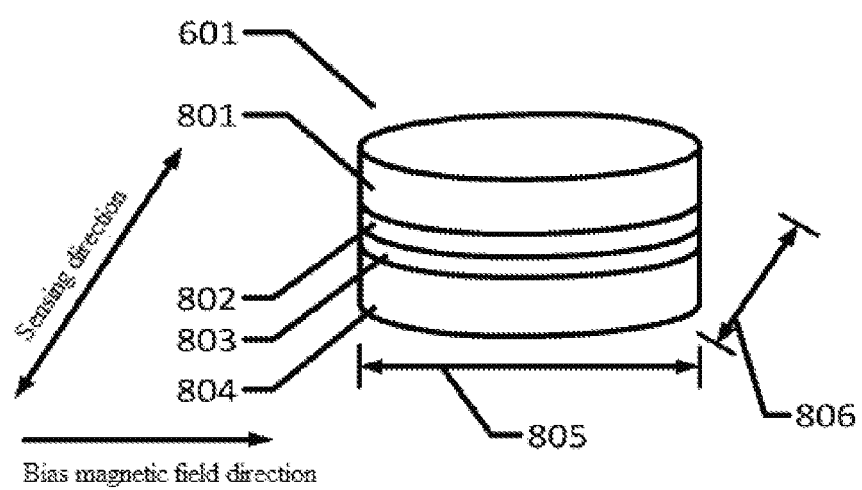
FIG. 8 is a schematic structural view of an MTJ in the first magnetic bias method.

FIG. 8 is a schematic structural view of the MTJ 601 in FIG. 7, wherein the MTJ 601 consists of a magnetic free layer 801, a tunnel barrier layer 802, a pinned layer 803 and an anti-ferromagnetic layer 804. Sizes of a major axis 805 and a minor axis 806 of the MTJ 601 are respectively 10 μm and 1.5 μm. The tunnel barrier layer 802 is generally composed of MgO or Al2O3, and makes up most of the resistance of the MTJ 601. The exchange coupling effect between the anti-ferromagnetic layer 804 and the pinned layer 803 decides the magnetization direction of the pinned layer 803. In this embodiment, the magnetization direction of the pinned layer 803 is parallel to the direction of the minor axis 806. The magnetization direction of the magnetic free layer 801 is affected by an outside magnetic field, and in the absence of an external magnetic field, the magnetization direction of the magnetic free layer 801 is parallel to the magnetization direction 703 of the permanent magnet 603. When there is paper money getting close to the chip, under the action of the paper money and a provided magnet in the magnetic currency detector head, the magnetization direction of the magnetic free layer 801 will change, and according to the tunneling effect, the resistance of the MTJ 601 also varies accordingly, and then detection of the paper money can be achieved through signal conversion.

Figure 9:
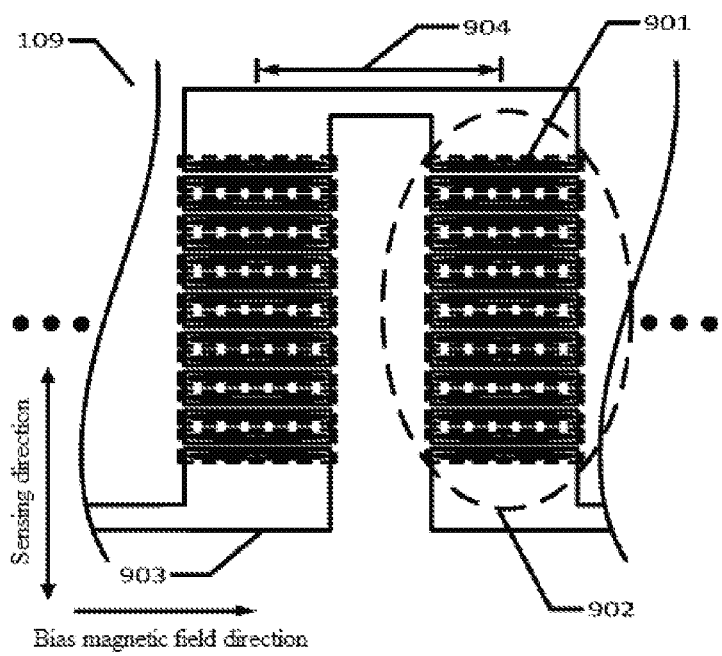
FIG. 9 is a schematic view of an MTJ unit formed in a second magnetic bias method.

Referring to FIG. 9, in the second form, the magnetic biasing structure consists of a magnetic film deposited on an MTJ, twelve MTJs 901 are connected in series to make up one MTJ string 902, and the MTJs 901 are arranged along the sensing direction of the magnetic field sensor chip, wherein a centre distance between two adjacent MTJs 901 is 1 μm to 20 μm, which is 6 μm in this embodiment. Seven MTJ strings 902 are connected in series to make up one MTJ unit 109, and the MTJ strings 902 are arranged along a direction perpendicular to the sensing direction of the magnetic field sensor chip, wherein a centre distance 904 between two adjacent MTJ strings 902 is 20 μm to 100 μm, which is 54 μm in this embodiment. Five MTJ units 109 are connected in parallel to make up one magnetoresistive element 108, and the MTJ units 109 are arranged along a direction perpendicular to the sensing direction of the magnetic field sensor chip. An electrical connection conductor 903 composed of a conductive material achieves an electrical connection between the two adjacent MTJ strings 902.

Figure 10:
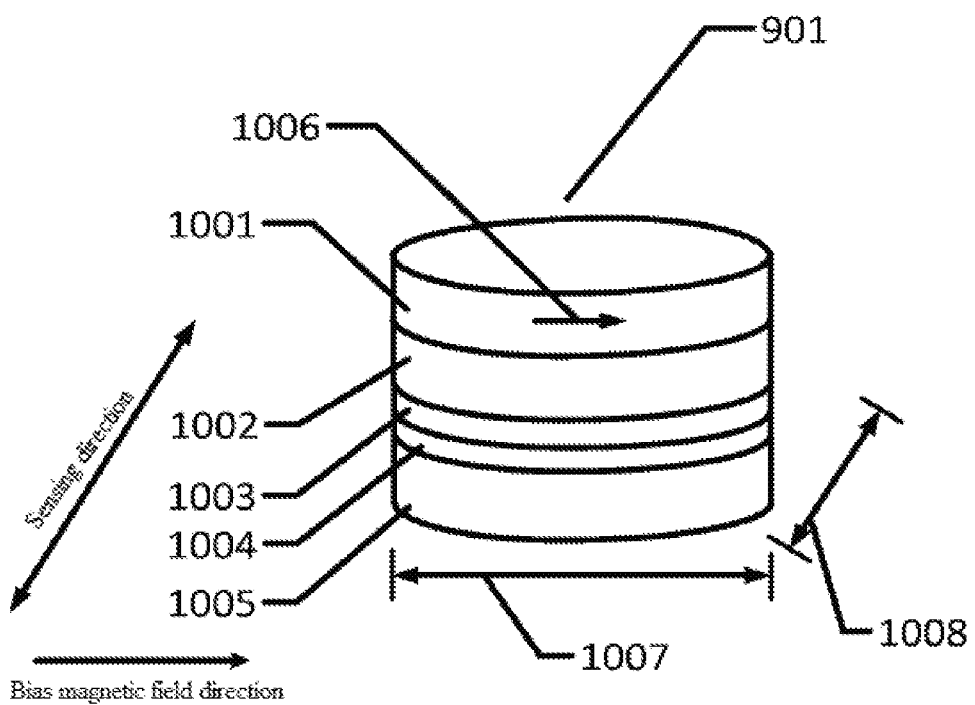
FIG. 10 is a schematic structural view of an MTJ in the second magnetic bias method.

FIG. 10 is a schematic structural view of the MTJ 901 in FIG. 9, wherein the MTJ 901 consists of a magnetic film 1001, a magnetic free layer 1002, a tunnel barrier layer 1003, a pinned layer 1004 and an anti-ferromagnetic layer 1005 that form a magnetic biasing structure. A ratio of lengths of a major axis and a minor axis of the MTJ 901 is greater than 3, of which the sizes are respectively 30 μm and 1.5 μm. The magnetization direction of the magnetic film 1001 is perpendicular to the sensing direction of the single magnetoresistor TMR magnetic field sensor chip and parallel to the direction of the major axis of the MTJ 901, used for reducing hysteresis thereof. According to shape anisotropy, the direction of the major axis of the MTJ 901 is the direction of its easy magnetization axis. The tunnel barrier layer 1003 is generally composed of MgO or Al2O3, and makes up most of the resistance of the MTJ 901. The exchange coupling effect between the anti-ferromagnetic layer 1005 and the pinned layer 1004 decides the magnetization direction of the pinned layer 1004. In order not to make the magnetic film 1001 magnetized by the magnetic excitation element to lead to failure, a magnetic field generated at the magnetic film 1001 by the magnetic excitation element should be less than half of the coercive force of the magnetic film 1001, and shall be less than 0.1 T.

In this embodiment, the magnetization direction of the pinned layer 1004 is parallel to the direction of the minor axis 1008. The magnetization direction of the magnetic free layer 1002 is affected by an outside magnetic field, and in the absence of an external magnetic field, the magnetization direction of the magnetic free layer 1002 is parallel to the magnetization direction 1006 of the magnetic film 1001; when there is paper money getting close to the chip, under the action of the paper money and a provided magnet in the magnetic currency detector head, the magnetization direction of the magnetic free layer 1002 will change, and according to the tunneling effect, the resistance of the MTJ 901 also varies accordingly. Then detection of the paper money can be achieved through signal conversion.

Figure 11:
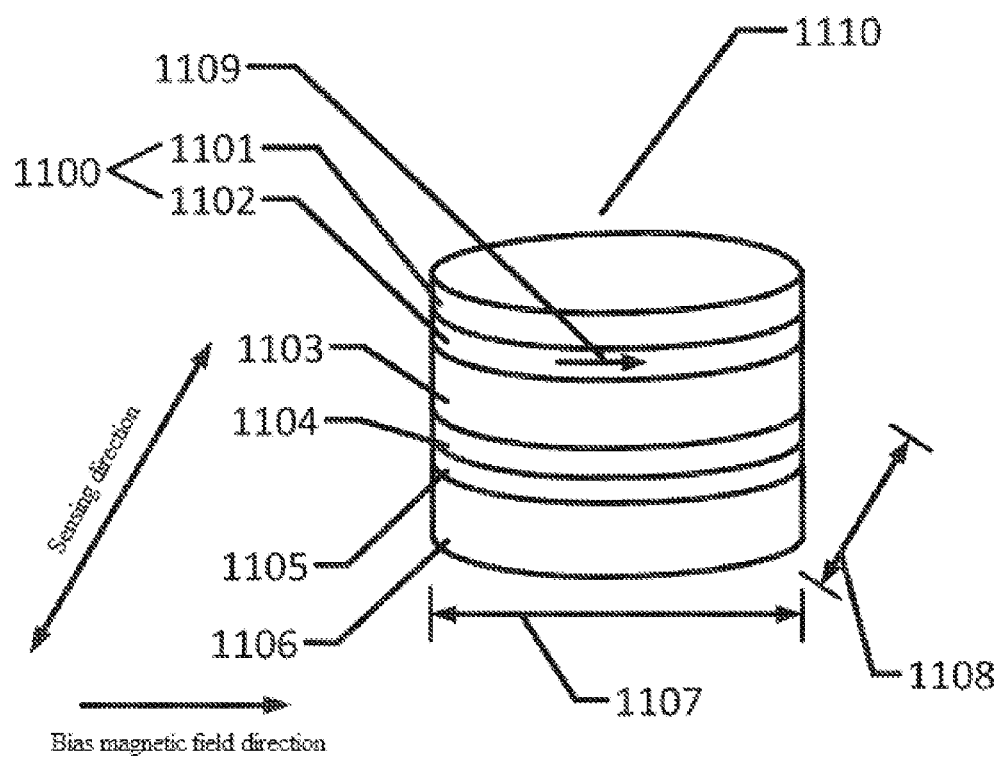
FIG. 11 is a schematic structural view of an MTJ in a third magnetic bias method.

The third form is as follows: the magnetic film 1001 in FIG. 10 may be replaced with an exchange interaction layer, an MTJ thus formed is as shown in FIG. 11, and the structure of the magnetoresistive unit formed with the method is the same as that of the magnetoresistive unit 109 in FIG. 9. An MTJ 1110 consists of an exchange interaction layer 1100, a magnetic free layer 1103, a tunnel barrier layer 1104, a pinned layer 1105 and an anti-ferromagnetic layer 1106, wherein the exchange interaction layer 1100 consists of an anti-ferromagnetic layer 1101 and a ferromagnetic layer 1102 weakly coupled with the anti-ferromagnetic layer 1101, and the ferromagnetic layer 1102 is located between the magnetic free layer 1103 and the anti-ferromagnetic layer 1101. The MTJ is in a shape of an ellipse, a ratio of lengths of a major axis and a minor axis of the MTJ 1110 is greater than 3, and in this embodiment, sizes of the major axis 1107 and the minor axis 1108 are respectively 30 μm and 1.5 μm. Under the exchange coupling effect with the anti-ferromagnetic layer 1101, the magnetization direction of the ferromagnetic layer 1102 is perpendicular to the sensing direction of the TMR magnetic field sensor chip and parallel to the direction of the major axis of the MTJ 1110, to reduce hysteresis. The magnetization direction of the magnetic free layer 1103 is affected by an outside magnetic field, and in the absence of an external magnetic field, the magnetization direction of the magnetic free layer 1103 is parallel to the magnetization direction 1109 of the ferromagnetic layer 1102; when there is paper money getting close to the chip, under the action of the paper money and a provided magnet in the magnetic currency detector head, the magnetization direction of the magnetic free layer 1103 will change, and according to the tunneling effect, the resistance of the MTJ 1110 also varies accordingly, and then detection of the paper money can be achieved through signal conversion.

Figure 12:
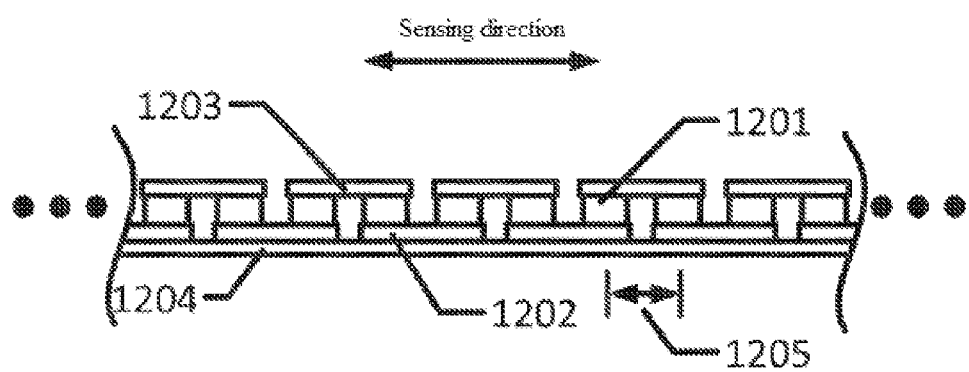
FIG. 12 is a schematic view of a connection mode among multiple MTJs.

FIG. 12 is a sectional view of a magnetoresistive string, and shows a connection mode among MTJs. A bottom electrode 1202 is located above a substrate 1204 and is electrically connected with the bottom of an MTJ 1201, and a top electrode 1203 is electrically connected with the top of the MTJ 1201. The top electrode and the bottom electrode are arranged alternately along the direction of the sensing direction of the magnetic field sensor chip, and thus form an electrical interconnection among the MTJs 1201 in an MTJ string, and a centre distance between two adjacent MTJs 1201 is 1205.

The present invention further provides a magnetic currency detector head manufactured by using the single magnetoresistor TMR magnetic field sensor chip described above, the magnetic head specifically including:

a signal processing circuit, a magnetic excitation element, an output pin, a circuit board and at least one of the single magnetoresistor TMR magnetic field sensor chip described above.

The magnetic excitation element is installed below the single magnetoresistor TMR magnetic field sensor chip, used for providing a magnetic excitation field, to generate an external magnetic field in the sensing direction of the chip in a measured space; the single magnetoresistor TMR magnetic field sensor chip senses the external magnetic field, and converts the external magnetic field to an electrical signal; and the signal processing circuit converts the electrical signal, which is transferred to the output pin through the circuit board.

Figure 2:
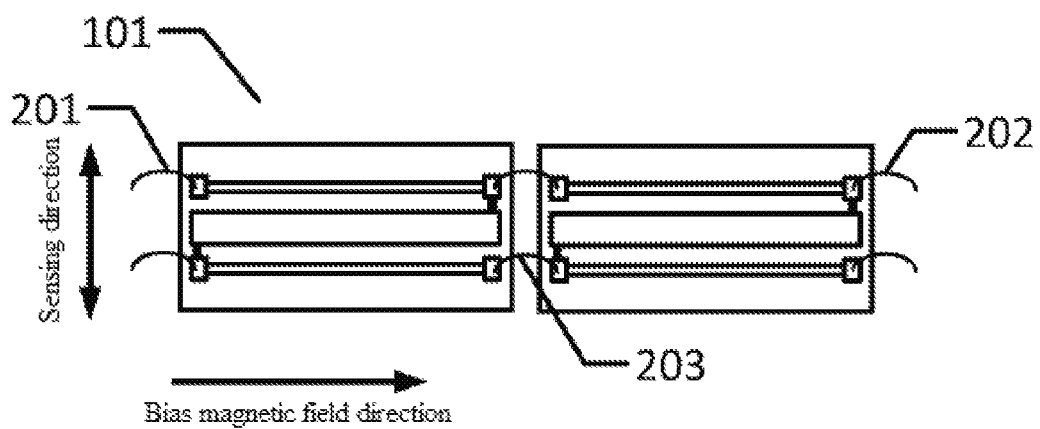
FIG. 2 is a schematic view of a connection mode between two or more single magnetoresistor TMR magnetic field sensor chips.

In order to increase the area of the sensing zone, it is feasible to connect multiple single magnetoresistor TMR magnetic field sensor chips together, to form a sensor chip combination. FIG. 2 is a schematic view of a connecting method of two or more single magnetoresistor TMR magnetic field sensor chips 101. Since each input or output terminal has two bonding pads, the multiple single magnetoresistor TMR magnetic field sensor chips 101 can achieve an electrical interconnection by means of wire bonding, and 201, 202 and 203 in FIG. 2 are interconnecting lines for wire bonding.

The aforementioned sensor chip combination may be applied to a magnetic currency detector head, wherein the area of the sensing zone is greater than the sensing area of a single one of the single magnetoresistor TMR magnetic field sensor chip, so as to increase the range of currency detection and improve the efficiency of currency detection.

The above introduces, in detail, a single magnetoresistor TMR magnetic field sensor chip which are implemented according to the present invention, and a magnetic currency detector head manufactured based on the chip, the principle and implementation manners of the present invention are described herein through specific examples, and the description about the embodiments above is merely provided for ease of understanding of the method and core ideas of the present invention; at the same time, those of ordinary skill in the art can make variations to the present invention in terms of the specific implementation manners and application scopes according to the ideas of the present invention. In conclusion, the contents of the specification shall not be construed as limitations to the present invention.

The invention claimed is:

1. A single magnetoresistor TMR magnetic field sensor chip, installed above a magnetic excitation element, a sensing direction of the chip being parallel to a surface of the chip, and a direction of a magnetic excitation field generated on the chip by the magnetic excitation element being perpendicular to the surface of the chip, wherein the single magnetoresistor TMR magnetic field sensor chip comprises:
a substrate,
a magnetic biasing structure deposited on the substrate,
a magnetoresistive element, and
an input terminal and an output terminal;
wherein the magnetoresistive element consists of at least one MTJ unit;
wherein the MTJ unit consists of at least one MTJ string;
wherein the MTJ string consists of at least one MTJ;
wherein the sensing directions of the magnetoresistive element and the at least one MTJ are the same as the sensing direction of the chip;
wherein the direction of a bias magnetic field generated on the chip by the magnetic excitation element is perpendicular to the sensing direction of the chip, and wherein
the magnetoresistive element consists of at least two MTJ units connected in parallel or connected in series, the MTJ units are arranged along a direction perpendicular or parallel to the sensing direction of the single magnetoresistor TMR magnetic field sensor chip, and a centre distance between two adjacent MTJ units is 200 µm to 800 µm; or
the MTJ units consist of at least two MTJ strings connected in parallel or connected in series, the MTJ strings are arranged along a direction perpendicular or parallel to the sensing direction of the single magnetoresistor TMR magnetic field sensor chip, and a centre distance between two adjacent MTJ strings is 20 µm to 100 µm; or
the MTJ strings consist of at least two MTJs connected in parallel or connected in series, the MTJs are arranged along a direction perpendicular or parallel to the sensing direction of the single magnetoresistor TMR magnetic field sensor chip, and a centre distance between two adjacent MTJs is 1 µm to 20 µm.

2. A single magnetoresistor TMR magnetic field sensor chip, installed above a magnetic excitation element, a sensing direction of the chip being parallel to a surface of the chip, and a direction of a magnetic excitation field generated on the chip by the magnetic excitation element being perpendicular to the surface of the chip, wherein the single magnetoresistor TMR magnetic field sensor chip comprises:
a substrate,
a magnetic biasing structure deposited on the substrate,
a magnetoresistive element, and
an input terminal and an output terminal;
wherein the magnetoresistive element consists of at least one MTJ unit;
wherein the MTJ unit consists of at least one MTJ string;
wherein the MTJ string consists of at least one MTJ;
wherein the sensing directions of the magnetoresistive element and the at least one MTJ are the same as the sensing direction of the chip;
wherein the direction of a bias magnetic field generated on the chip by the magnetic excitation element is perpendicular to the sensing direction of the chip, and
wherein the shape of the MTJ viewed from above is an ellipse, a ratio of lengths of its major axis and minor axis is greater than 3, and the minor axis of the MTJ is parallel to the sensing direction of the chip.

3. The single magnetoresistor TMR magnetic field sensor chip according to claim 2, wherein the magnetic biasing structure consists of an exchange interaction layer deposited on the MTJ, and the exchange interaction layer comprises an anti-ferromagnetic layer and a ferromagnetic layer weakly coupled with the anti-ferromagnetic layer.

4. The single magnetoresistor TMR magnetic field sensor chip according to claim 2, wherein, in the absence of an external magnetic field, a magnetization direction of a free layer in the MTJ, under the action of the magnetic biasing structure, is parallel to the direction of the major axis of the MTJ.

5. The single magnetoresistor TMR magnetic field sensor chip according to claim 2, wherein the magnetic biasing structure is blocked or layered, and is made of an alloy consisting of Cr, Co, Pt, Pd, Ni or Fe.

6. A single magnetoresistor TMR magnetic field sensor chip, installed above a magnetic excitation element, a sensing direction of the chip being parallel to a surface of the chip, and a direction of a magnetic excitation field generated on the chip by the magnetic excitation element being perpendicular to the surface of the chip, wherein the single magnetoresistor TMR magnetic field sensor chip comprises:
   a substrate,
   a magnetic biasing structure deposited on the substrate,
   a magnetoresistive element, and
   an input terminal and an output terminal;
   wherein the magnetoresistive element consists of at least one MTJ unit;
   wherein the MTJ unit consists of at least one MTJ string;
   wherein the MTJ string consists of at least one MTJ;
   wherein the sensing directions of the magnetoresistive element and the at least one MTJ are the same as the sensing direction of the chip;
   wherein the direction of a bias magnetic field generated on the chip by the magnetic excitation element is perpendicular to the sensing direction of the chip,
   wherein the magnetic biasing structure consists of a permanent magnet between two adjacent MTJ strings;
   wherein along a magnetization direction of the permanent magnet, two sides of the MTJ are both provided with the permanent magnet; and
   wherein a magnetic field generated at the permanent magnet by the magnetic excitation element is less than half of the coercive force of the permanent magnet, and is less than 0.1 T.

7. A single magnetoresistor TMR magnetic field sensor chip, installed above a magnetic excitation element, a sensing direction of the chip being parallel to a surface of the chip, and a direction of a magnetic excitation field generated on the chip by the magnetic excitation element being perpendicular to the surface of the chip, wherein the single magnetoresistor TMR magnetic field sensor chip comprises:
   a substrate,
   a magnetic biasing structure deposited on the substrate,
   a magnetoresistive element, and
   an input terminal and an output terminal;
   wherein the magnetoresistive element consists of at least one MTJ unit;
   wherein the MTJ unit consists of at least one MTJ string;
   wherein the MTJ string consists of at least one MTJ;
   wherein the sensing directions of the magnetoresistive element and the at least one MTJ are the same as the sensing direction of the chip;
   wherein the direction of a bias magnetic field generated on the chip by the magnetic excitation element is perpendicular to the sensing direction of the chip,
   wherein the magnetic biasing structure consists of a magnetic film deposited on the MTJ; and
   wherein a magnetic field generated at the magnetic film by the magnetic excitation element is less than half of the coercive force of the magnetic film, and is less than 0.1 T.

8. A single magnetoresistor TMR magnetic field sensor chip, installed above a magnetic excitation element, a sensing direction of the chip being parallel to a surface of the chip, and a direction of a magnetic excitation field generated on the chip by the magnetic excitation element being perpendicular to the surface of the chip, wherein the single magnetoresistor TMR magnetic field sensor chip comprises:
   a substrate,
   a magnetic biasing structure deposited on the substrate,
   a magnetoresistive element, and
   an input terminal and an output terminal;
   wherein the magnetoresistive element consists of at least one MTJ unit;
   wherein the MTJ unit consists of at least one MTJ string;
   wherein the MTJ string consists of at least one MTJ;
   wherein the sensing directions of the magnetoresistive element and the at least one MTJ are the same as the sensing direction of the chip;
   wherein the direction of a bias magnetic field generated on the chip by the magnetic excitation element is perpendicular to the sensing direction of the chip, and
   wherein both the input and output terminals at least comprise two wire bonding pads, and each wire bonding pad is located on two ends of the single magnetoresistor TMR magnetic field sensor chip.

9. The single magnetoresistor TMR magnetic field sensor chip according to claim 8, wherein multiple single magnetoresistor TMR magnetic field sensor chips are electrically connected with each other through the wire bonding pads, to form a sensor chip combination, and the sensing zone area of the sensor chip combination is greater than that of a single one of the single magnetoresistor TMR magnetic field sensor chips.

10. The single magnetoresistor TMR magnetic field sensor chip according to claim 8, wherein the wire bonding pad has a length of 15 μm to 2000 μm and a width of 15 μm to 1000 μm.

11. A single magnetoresistor TMR magnetic field sensor chip, installed above a magnetic excitation element, a sensing direction of the chip being parallel to a surface of the chip, and a direction of a magnetic excitation field generated on the chip by the magnetic excitation element being perpendicular to the surface of the chip, wherein the single magnetoresistor TMR magnetic field sensor chip comprises:
   a substrate,
   a magnetic biasing structure deposited on the substrate,
   a magnetoresistive element, and
   an input terminal and an output terminal;
   wherein the magnetoresistive element consists of at least one MTJ unit;
   wherein the MTJ unit consists of at least one MTJ string;
   wherein the MTJ string consists of at least one MTJ;
   wherein the sensing directions of the magnetoresistive element and the at least one MTJ are the same as the sensing direction of the chip;
   wherein the direction of a bias magnetic field generated on the chip by the magnetic excitation element is perpendicular to the sensing direction of the chip, and
   wherein the substrate is provided thereon with an electrical connection conductor for achieving an electrical connection, and the width of the electrical connection conductor is not less than 10 μm.

12. A single magnetoresistor TMR magnetic field sensor chip, installed above a magnetic excitation element, a sensing direction of the chip being parallel to a surface of the chip, and a direction of a magnetic excitation field generated on the chip by the magnetic excitation element being perpendicular to the surface of the chip, wherein the single magnetoresistor TMR magnetic field sensor chip comprises:
   a substrate,
   a magnetic biasing structure deposited on the substrate,
   a magnetoresistive element, and
   an input terminal and an output terminal;
   wherein the magnetoresistive element consists of at least one MTJ unit;

wherein the MTJ unit consists of at least one MTJ string;
wherein the MTJ string consists of at least one MTJ;
wherein the sensing directions of the magnetoresistive element and the at least one MTJ are the same as the sensing direction of the chip;
wherein the direction of a bias magnetic field generated on the chip by the magnetic excitation element is perpendicular to the sensing direction of the chip, and
wherein the single magnetoresistor TMR magnetic field sensor chip has a length of 500 μm to 3000 μm and a width of 20 μm to 1500 μm.

13. A magnetic currency detector head, the magnetic head comprising:
a single magnetoresistor TMR magnetic field sensor chip,
a substrate,
a magnetic biasing structure deposited on the substrate,
a magnetoresistive element, and
an input terminal and an output terminal;
wherein the magnetoresistive element consists of at least one MTJ unit;
wherein the MTJ unit consists of at least one MTJ string;
wherein the MTJ string consists of at least one MTJ;
wherein the sensing directions of the magnetoresistive element and the at least one MTJ are the same as a sensing direction of the chip;
wherein the direction of a bias magnetic field generated on the chip by the magnetic excitation element is perpendicular to the sensing direction of the chip
a signal processing circuit,
a magnetic excitation element, wherein the single magnetoresistor TMR magnetic field sensor chip is installed above the magnetic excitation element, the sensing direction of the chip is parallel to a surface of the chip, and a direction of a magnetic excitation field generated on the chip by the magnetic excitation element is perpendicular to the surface of the chip,
an output pin and
a circuit board;
wherein the magnetic excitation element is installed below the single magnetoresistor TMR magnetic field sensor chip, used for providing a magnetic excitation field, to generate an external magnetic field in the sensing direction of the chip in a measured space;
wherein the single magnetoresistor TMR magnetic field sensor chip is configured to sense the external magnetic field, and converts the external magnetic field to an electrical signal; and
wherein the signal processing circuit is configured to convert the electrical signal, which is transferred to the output pin through the circuit board.

* * * * *

UNITED STATES PATENT AND TRADEMARK OFFICE
CERTIFICATE OF CORRECTION

PATENT NO. : 9,804,235 B2  
APPLICATION NO. : 14/907691  
DATED : October 31, 2017  
INVENTOR(S) : Deak et al.

Page 1 of 1

It is certified that error appears in the above-identified patent and that said Letters Patent is hereby corrected as shown below:

On the Title Page

In item (71), in "Applicant", in Column 1, Line 1, delete "Multidimension" and insert --MultiDimension-- therefor In item (30), in "Foreign Application Priority Data", in Column 1, Line 1, delete "2013 2 0451445 U" and insert --201320451445.2-- therefor In the Claims In Column 11, Line 23, in Claim 6, delete "chip," and insert --chip;-- therefor In Column 14, Line 3, in Claim 13, after "chip", insert --,--

In Column 14, Line 12, in Claim 13, after "pin", insert --,--

Signed and Sealed this  
Eleventh Day of June, 2019

Andrei Iancu  
*Director of the United States Patent and Trademark Office*